(12) United States Patent
Paz de Araujo et al.

(10) Patent No.: US 10,014,468 B2
(45) Date of Patent: Jul. 3, 2018

(54) BARRIER LAYER FOR CORRELATED ELECTRON MATERIAL

(71) Applicant: ARM Ltd., Cambridge (GB)

(72) Inventors: Carlos Alberto Paz de Araujo, Colorado Springs, CO (US); Kimberly Gay Reid, Austin, TX (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/499,212

(22) Filed: Apr. 27, 2017

(65) Prior Publication Data

US 2017/0250340 A1 Aug. 31, 2017

Related U.S. Application Data

(63) Continuation of application No. 15/056,877, filed on Feb. 29, 2016, now Pat. No. 9,660,189.

(51) Int. Cl.
*H01L 47/00* (2006.01)
*H01L 45/00* (2006.01)

(52) U.S. Cl.
CPC ........... *H01L 45/146* (2013.01); *H01L 45/08* (2013.01); *H01L 45/1233* (2013.01); *H01L 45/1246* (2013.01); *H01L 45/1253* (2013.01); *H01L 45/1608* (2013.01)

(58) Field of Classification Search
CPC ... H01L 45/146; H01L 45/08; H01L 45/1233; H01L 45/1246; H01L 45/1253; H01L 45/1608; C23C 16/45553; C23C 16/56; G11C 13/004; G11C 13/0069
USPC .......................................................... 257/4
See application file for complete search history.

(56) References Cited

U.S. PATENT DOCUMENTS

| | | | |
|---|---|---|---|
| 7,298,640 | B2 | 11/2007 | Chen et al. |
| 7,639,523 | B2 | 12/2009 | Celinska et al. |
| 7,778,063 | B2 | 8/2010 | Brubaker et al. |
| 7,872,900 | B2 | 1/2011 | Paz de Araujo et al. |
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 9,627,615 | B1 | 4/2017 | Reid et al. |
| 9,660,189 | B1 | 5/2017 | Reid |
| 2003/0108674 | A1* | 6/2003 | Chung ............... C23C 16/34 427/255.394 |
| 2008/0106925 | A1* | 5/2008 | Paz de Araujo ..... H01L 45/04 365/148 |
| 2008/0106926 | A1 | 5/2008 | Brubaker |
| 2008/0107801 | A1 | 5/2008 | Celinska et al. |

(Continued)

FOREIGN PATENT DOCUMENTS

| | | |
|---|---|---|
| WO | 2008/058264 A2 | 5/2008 |
| WO | 2009/114796 A1 | 9/2009 |

OTHER PUBLICATIONS

U.S. Appl. No. 15/056,877, filed Feb. 29, 2016, 74 pages.

(Continued)

*Primary Examiner* — Tu-Tu Ho
(74) *Attorney, Agent, or Firm* — Berkeley Law & Technology Group, LLP

(57) ABSTRACT

Subject matter disclosed herein may relate to correlated electron switch devices, and may relate more particularly to one or more barrier layers having various characteristics formed under and/or over and/or around correlated electron material.

19 Claims, 12 Drawing Sheets

(56) References Cited

U.S. PATENT DOCUMENTS

| | | |
|---|---|---|
| 2008/0278990 A1 | 11/2008 | Kumar |
| 2010/0124800 A1* | 5/2010 | Park .................. H01L 45/143 438/102 |
| 2013/0037776 A1* | 2/2013 | Nishi .................. H01L 45/085 257/3 |
| 2013/0134383 A1 | 5/2013 | Hwang |
| 2013/0200323 A1 | 8/2013 | Pham et al. |
| 2013/0214232 A1 | 8/2013 | Tendulkar et al. |
| 2013/0285699 A1 | 10/2013 | McWilliams et al. |
| 2014/0024195 A1* | 1/2014 | Park .................. H01L 45/06 438/382 |
| 2014/0175355 A1* | 6/2014 | Wang .................. H01L 45/08 257/2 |
| 2016/0154452 A1 | 6/2016 | Hansson et al. |
| 2016/0163978 A1 | 6/2016 | Paz de Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

U.S. Appl. No. 15/056,877/ Filing Receipt, Mar. 15, 2016, 3 pages.
U.S. Appl. No. 15/056,877/ Non-Final Rejection, dated Aug. 26, 2016, 8 pages.
U.S. Appl. No. 15/056,877/ Amendment/Req. Reconsideration-After Non-Final Reject, dated Nov. 28, 2016, 13 pages.
U.S. Appl. No. 15/056,877/ Notice of Allowance and Fees Due, dated Jan. 18, 2017, 5 pages.
U.S. Appl. No. 15/056,877/ Issue Fee Payment, Apr. 17, 2017, 1 page.
U.S. Appl. No. 15/056,877/ Issue Notification, May 3, 2017, 1 page.
PCT/GB2017/050529: International Search Report and Written Opinion, dated May 22, 2017, 13 pages.

\* cited by examiner

Chemical Vapor Deposition (CVD)

460

Expose a substrate, in a chamber, to two or more precursors that combine before or at the substrate where one precursor contains a transition metal, transition metal compound or transition metal oxide and a ligand, and the other precursor molecule contains oxygen, carbon, or nitrogen. The precursors enter the chamber as gases or vapors and a film is formed on a substrate such that a correlated electron material, such as NiO, is deposited with an atomic concentration of carbon of between 0.1% and 10.0%.

FIG. 4b

Physical Vapor Deposition (PVD) or Sputter

470

Expose a substrate (heated or at room temperature) in a chamber to reactant(s) by producing a vapor of the source material through heating a source containing the material or sputtering the material from a target made of the material. The vaporized material is then deposited on the substrate. An example is to sputter a nickel oxide target under vacuum with a substrate in "line of sight". Nickel oxide then deposits on the substrate. Alternatively, the metal (such as nickel) can be sputtered from a target and the transition metal oxide formed in a subsequent oxidation process and in either case carbon is incorporated by either: 1) co sputter of a carbon containing target; 2) sputter in a carbon containing ambient, such as CO; 3) after sputter the carbon is incorporated by a post sputter deposition treatment (for example annealing in CO). The CEM film (e.g. NiO) is formed on a substrate with an atomic concentration of carbon of between 0.1% and 10.0%.

FIG. 4c

BARRIER LAYER FOR CORRELATED ELECTRON MATERIAL

This application is a continuation of U.S. patent application Ser. No. 15/056,877, titled BARRIER LAYER FOR CORRELATED ELECTRON MATERIAL, filed Feb. 29, 2016, and is incorporated herein by reference in its entirety.

BACKGROUND

Field

Subject matter disclosed herein may relate to correlated electron switch devices, and may relate more particularly to one or more barrier layers having various characteristics formed under and/or over and/or around correlated electron material.

Information

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, etc. Factors related to electronic switching devices, such as may be incorporated in memory and/or logic devices, that may be of interest to a designer in considering suitability for any particular application may include physical size, storage density, operating voltages, impedance ranges and/or power consumption, for example. Other example factors that may be of interest to designers may include cost of manufacture, ease of manufacture, scalability, and/or reliability. Moreover, there appears to be an ever increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 4b depicts a simplified flowchart for an example process for fabricating correlated electron material devices, in accordance with an embodiment.

FIG. 4c depicts a simplified flowchart for an example process for fabricating correlated electron material devices, in accordance with an embodiment.

Figure 1:
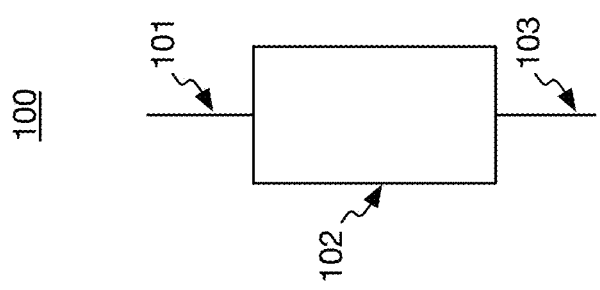
FIG. 1 shows block diagram of an example embodiment of a correlated electron switch device comprising a correlated electron material, in accordance with an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) to form a correlated electron switch, for example, such as may be utilized to form a correlated electron random access memory (CERAM) in memory and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects. In this context, a CEM switch may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in conductive and resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of a CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of a CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating a CEM and, therefore, a CEM may exhibit higher capacitance based, at least in part, on additional charges stored within a CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of a CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, one or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM device may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, yttrium, and zinc (which may be linked to a cation, such as oxygen or other types of ligands), or combinations thereof, although claimed subject matter is not limited in scope in this respect.

FIG. 1 shows an example embodiment 100 of a CES device comprising CEM, such as one or more materials 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, a CEM, such as material 102, may transition between aforementioned relatively conductive/lower impedance states and relatively insulative/higher impedance states. As mentioned, a CEM, such as one or more materials 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

Figure 2:
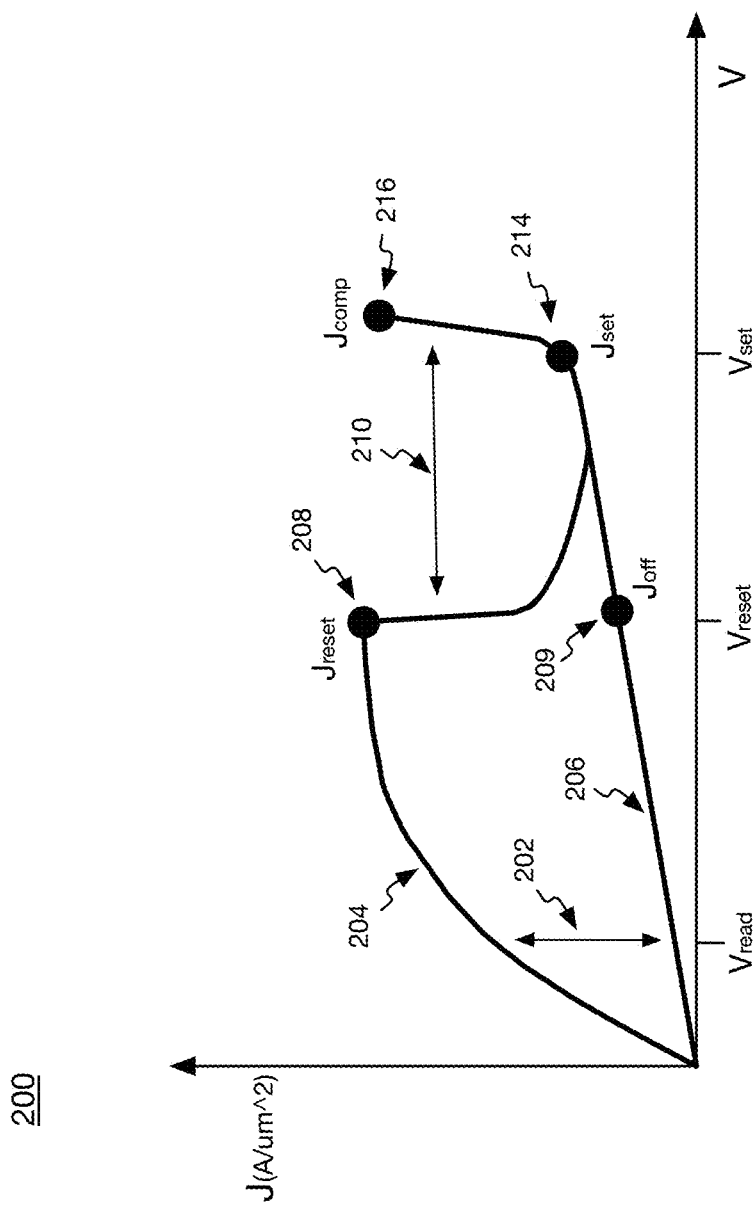
FIG. 2 shows a plot of current density versus voltage for a correlated electron switch, in according to an embodiment.

FIG. 2 is a diagram showing an example voltage versus current density profile of a device formed from a CEM according to an embodiment 200. Based, at least in part, on a voltage applied to terminals of a CEM device, for example, during a "write operation," a CEM device may be placed into a relatively low-impedance state or a relatively high-impedance state. For example, application of a voltage $V_{set}$ and a current density $J_{set}$ may place a CEM device into a relatively low-impedance memory state. Conversely, application of a voltage $V_{reset}$ and a current density $J_{reset}$ may place a CEM device into a relatively high-impedance memory state. As shown in FIG. 2, reference designator 210 illustrates the voltage range that may separate $V_{set}$ from $V_{reset}$. Following placement of a CEM device into an high-impedance state or low-impedance state, the particular state of a CEM device may be detected by application of a voltage $V_{read}$ (e.g., during a read operation) and detection of a current or current density at terminals of a CEM device.

According to an embodiment, a CEM device of FIG. 2 may include any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, a CEM device of FIG. 2 may comprise materials of the general form AB:$L_x$ (such as NiO:CO) where AB represents a transition metal, transition metal compound, or transition metal oxide variable impedance material and $L_x$ represents a dopant ligand; though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, $L_x$, which may establish and/or stabilize variable impedance properties. In particular, NiO variable impedance materials disclosed herein may include a carbon-containing ligand such as carbonyl (CO), forming NiO:CO.

In another particular example, NiO doped with extrinsic ligands may be expressed as NiO:$L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. In particular, NiO variable impedance materials disclosed herein may include carbon containing molecules of the form $C_aH_bN_dO_f$ (in which a≥1, and b, d and f≥0) such as: carbonyl (CO), cyano (CN⁻), ethylene diamine ($C_2H_8N_2$), phen(1,10-phenanthroline) ($C_{12}H_8N_2$), bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate (NCS⁻), for example.

In accordance with FIG. 2, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a substantially dissimilar impedance state, such as a relatively high-impedance state, responsive to a Mott transition. This may correspond to point 208 of the voltage versus current density profile of FIG. 2. At, or suitably nearby this point, electrons are no longer screened and become localized. This correlation may result in a strong electron-electron interaction potential which may operate to split the bands to form a relatively high-impedance material. If a CEM device comprises a relatively high-impedance state, current may generated by transportation of electron holes. Consequently, if a threshold voltage is applied across terminals of a CEM device, electrons may be injected into a metal-insulator-metal (MIM) diode over the potential barrier of the MIM device. If a threshold current of electrons is injected and a threshold potential is applied across terminals to place a CEM device into a "set" state, an increase in electrons may screen electrons and remove a localization of electrons, which may operate to collapse the band-splitting potential, thereby bringing about a relatively low-impedance state.

According to an embodiment, current in a CEM device may be controlled by an externally applied "compliance" condition, which may be determined at least partially on the basis of an applied external current, which may be limited during a write operation, for example, to place a CEM device into a relatively high-impedance state. This externally-applied compliance current may, in some embodiments, also set a condition of a current density for a subsequent reset operation to place a CEM device into a relatively high-impedance state. As shown in the particular implementation of FIG. 2, a current density $J_{comp}$ may be applied during a write operation at point 116 to place a CEM device into a relatively high-impedance state, may determine a compliance condition for placing a CEM device into a low-impedance state in a subsequent write operation. As shown in FIG. 2, a CEM device may be subsequently placed into a low-impedance state by application of a current density $J_{reset} \geq J_{comp}$ at a voltage $V_{reset}$ at point 208, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to a CEM device for subsequently transitioning a CEM device to a relatively high-impedance memory state.

As pointed out above, a reset condition may occur in response to a Mott transition at point 208. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 204 of the voltage versus current density profile shown in FIG. 2, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$
$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

In which $A_{CEM}$ is a cross-sectional area of a CEM device; and $J_{reset}(V_{MI})$ may represent a current density through a CEM device to be applied to a CEM device at a threshold voltage $V_{MI}$, which may place a CEM device in a relatively high-impedance state.

Figure 3:
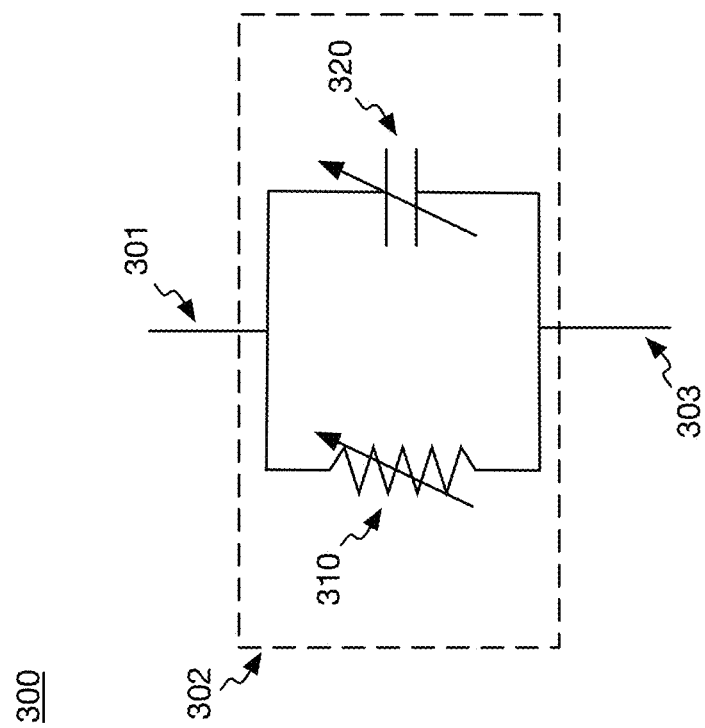
FIG. 3 is a schematic diagram of an equivalent circuit of a correlated electron switch, in accordance with an embodiment.

FIG. 3 depicts a schematic diagram of an equivalent circuit of an example CEM switch device according to an embodiment 300. As previously mentioned, a correlated electron device, such as a CEM switch, a CERAM array, or other type of device utilizing one or more correlated electron materials may comprise variable or complex impedance device that may exhibit characteristics of both variable resistance and variable capacitance. In other words, impedance characteristics for a CEM variable impedance device, such as the device according to embodiment 300, may depend at least in part on resistance and capacitance characteristics of the device if measured across device terminals 301 and 302, for example. In an embodiment, an equivalent circuit for a variable impedance device may comprise a variable resistor, such as variable resistor 310, in parallel with a variable capacitor, such as variable capacitor 320. Of course, although a variable resistor 310 and variable capacitor 320 are depicted in FIG. 3 as comprising discrete components, a variable impedance device, such as device of embodiment 300, may comprise a substantially homogenous CEM and claimed subject matter is not limited in this respect.

Table 1 below depicts an example truth table for an example variable impedance device, such as the device of embodiment 300.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, Table 1 shows that a resistance of a variable impedance device, such as the device of embodiment 300, may transition between a low-impedance state and a substantially dissimilar high-impedance state as a function at least partially dependent on a voltage applied across a CEM device. In an embodiment, an impedance exhibited at a low-impedance state may be approximately in the range of 10.0-100,000.0 times lower than a substantially dissimilar impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Truth Table 1 shows that a capacitance of a variable impedance device, such as the device of embodiment 300, may transition between a relatively lower capacitance state, which, in an example embodiment, may comprise approximately zero, or very little, capacitance, and a relatively higher capacitance state that is a function, at least in part, of a voltage applied across a CEM device.

According to an embodiment, a CEM device, which may be utilized to form a CEM switch, a CERAM memory device, and/or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of a CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In one or more embodiments, changes in impedance states of CEM devices, such as from a relatively low-impedance state to a substantially dissimilar high-impedance state, for example, may be brought about by the "back-donation" of electrons of compounds comprising $Ni_x:N_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of the lattice structure, for example, comprising the transition metal, transition metal oxide, or combination thereof. Back-donation permits a transition metal, transition metal oxide, or combination thereof, to maintain an ionization state that is favorable to electrical conduction under the influence of an applied voltage. In one or more embodiments, back-donation in a correlated electron material, for example, may occur responsive to use of a dopant, such as carbonyl (CO), controllably and reversibly "donate" electrons to a conduction band of the transition metal or transition metal oxide, such as nickel, for example, during operation. Back-donation may be reversed, in a nickel oxide material, for example, (e.g., NiO:CO), which may thereby permit the nickel oxide material to switch to exhibiting a high-impedance property during device operation. Thus, in this context, a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, a CEM switch comprising a transition metal or a transition metal oxide, may exhibit low-impedance properties if the transition metal, such as nickel, for example, is placed into an oxidation state of 2+ (e.g., $Ni^{2+}$ in a material, such as NiO:CO). Conversely, electron back-donation may be reversed if the transition metal, such as nickel, for example, is placed into an oxidation state of either 1+ or 3+. Accordingly, back-donation may result in "disproportionation," which may comprise substantially simultaneous oxidation and reduction reaction, such as:

$$2Ni^{2+} \rightarrow Ni^{1+} + Ni^{3+} \qquad (4)$$

Such disproportionation, in this instance refers to formation of nickel ions as $Ni^{1+} + Ni^{3+}$ as shown in expression (4), which may bring about, for example, a relatively high-impedance state during operation of a CEM device. In an embodiment, a carbon-containing ligand, such as a carbonyl molecule (CO), may permit sharing of electrons during operation of the CEM device so as to permit the disproportionation reaction and its reversal:

$$Ni^{1+} + Ni^{3+} \rightarrow 2Ni^{2+} \qquad (5)$$

As previously mentioned, reversal of the disproportionation reaction, as shown in expression (5), permits nickel-based CEM to return to a relatively low-impedance state, in one or more embodiment.

In one or more embodiments, depending on an atomic concentration of carbon in NiO:CO, for example, which may vary from values approximately in the range of an atomic percentage of 0.1% to 10.0%, $V_{reset}$ and $V_{set}$, as shown in FIG. 2, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of a back-donating material, such as NiO:CO and other materials present in a CEM device, as well as other process variations, and claimed subject matter is not limited in this respect.

In certain embodiments, atomic layer deposition may be utilized to form films comprising nickel oxide materials, such as NiO:CO, to permit electron back-donation during operation of the device in a circuit environment, for example, to give rise to a low-impedance state. Also during operation in a circuit environment, for example, electron back-donation may be reversed so as to give rise to a high-impedance state, for example. In particular embodiments, atomic layer deposition may utilize two or more "precursor" sources to deposit components of, for example, NiO:CO, or other transition metal oxide, transition metal compounds or combinations thereof, onto a conductive substrate. In an embodiment, layers of a CEM device may be deposited utilizing separate molecules, AX and BY, according to expression (6), below:

$$AX_{(gas)} + BY_{(gas)} = AB_{(solid)} + XY_{(gas)} \qquad (6)$$

Wherein "A" of expression (6) corresponds to a transition metal, transition metal oxide, or any combination thereof. In embodiments, a transition metal oxide may comprise nickel, but may comprise other transition metals and/or transition metal oxides, such as aluminum, cadmium, chromium, cobalt, copper, gold, iron, manganese, mercury, molybdenum, nickel palladium, rhenium, ruthenium, silver, tin, titanium, vanadium.

In particular embodiments, CEM compounds that comprise more than one transition metal oxide may also be utilized, such as yttrium titanate ($YTiO_3$). "X" of expression (6) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-amino-pent-2-en-4-onato $(apo)_2$, $(dmamb)_2$ where dmamb=1-dimethylamino-2-methyl-2-butanolate, (dmamp)2 where dmamp=1-dimethylamino-2-methyl-2-propanolate, Bis(pentamethylcyclopentadienyl) $(C_5(CH_3)_5)_2$ and carbonyl $(CO)_4$. Accordingly, in some embodiments, nickel-based precursors AX may comprise, for example, nickel amidinates (Ni(AMD)) an example of which is $Ni(MeC(NBu)_2)_2$, nickel dicyclopentadienyl $(Ni(Cp)_2)$, nickel diethylcyclopentadienyl $(Ni(EtCp)_2)$, Bis(2,2,6,6-tetramethylheptane-3,5-dionato)Ni(II) $(Ni(thd)_2)$, nickel acetylacetonate $(Ni(acac)_2)$, bis(methylcyclopentadienyl)nickel $(Ni(CH_3C_5H4)_2$, Nickel dimethylglyoximate $(Ni(dmg)_2)$, Nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, Bis(pentamethylcyclopentadienyl) nickel $(Ni(C_5(CH_3)_5)_2$, and nickel carbonyl $(Ni(CO)_4)$, just to name a few examples.

In expression (6), "BY" may comprise an oxidizer, such as oxygen $(O_2)$, ozone $(O_3)$, nitric oxide (NO), nitrous oxide $(N_2O)$, hydrogen peroxide $(H_2O_2)$, water $(H_2O)$, just to name a few examples. In embodiments, the AX compound may comprise a transition metal oxide or a transition metal compound. BY may comprise a species chosen such that the reaction shown of expression (6) may form AB, wherein AB represents the CEM formed by the process. In other embodiments, plasma may be used with an oxidizer to form oxygen radicals or other activated species to form the CEM. In other embodiments, the CEM may be formed by chemical vapor deposition of any type or by sputter deposition or by physical vapor deposition. Therefore, in some embodiments, the X and/or Y may not be required to form AB (such as in the case of sputtering from a target of AB or co sputtering from a target of A and a target of B, or sputtering from a target of A in an ambient environment comprising B. It should be noted that concentrations, such as atomic concentration, of precursor, such as AX and BY may be adjusted so as to bring about a final atomic concentration of carbon, such as in the form of carbonyl, of between approximately 0.1% and 10.0%. However, claimed subject matter is not necessarily limited to the above-identified precursors and/or concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition or the like, utilized in fabrication of CEM devices.

In particular embodiments, such as embodiments utilizing atomic layer deposition, a substrate may be exposed to precursors in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:CO is performed, temperature ranges approximately in the range of 20.0° C. and 400.0° C. may be utilized. After exposure to precursor sources, such sources may be purged from the heated chamber, wherein purging may occur over durations approximately in the range of 0.5 seconds to 180.0 seconds. It should be noted, however, that these are merely examples of potentially suitable temperatures and exposure times, and claimed subject matter is not limited in this respect.

In certain embodiments, a single two-precursor cycle utilizing atomic layer deposition may bring about a CEM device layer comprising a thickness approximately in the range of 0.6 Å to 1.5 Å. Accordingly, in an embodiment, to form a CEM device film comprising a thickness of approximately 500 Å utilizing an atomic layer deposition process in which layers comprise a thickness of approximately 0.6 Å, 800-900 two-precursor cycles, such as AX+BY of equation (6), for example, may be utilized. In another embodiment, utilizing an atomic layer deposition process in which layers comprise approximately 1.5 Å, 300 to 350 two-precursor cycles, such as AX+BY, for example, may be utilized. It should be noted that atomic layer deposition may be utilized to form CEM device films having other thicknesses, such as thicknesses approximately in the range of 1.5 nm and 150.0 nm, for example, and claimed subject matter is not limited in this respect.

Figure 4A:
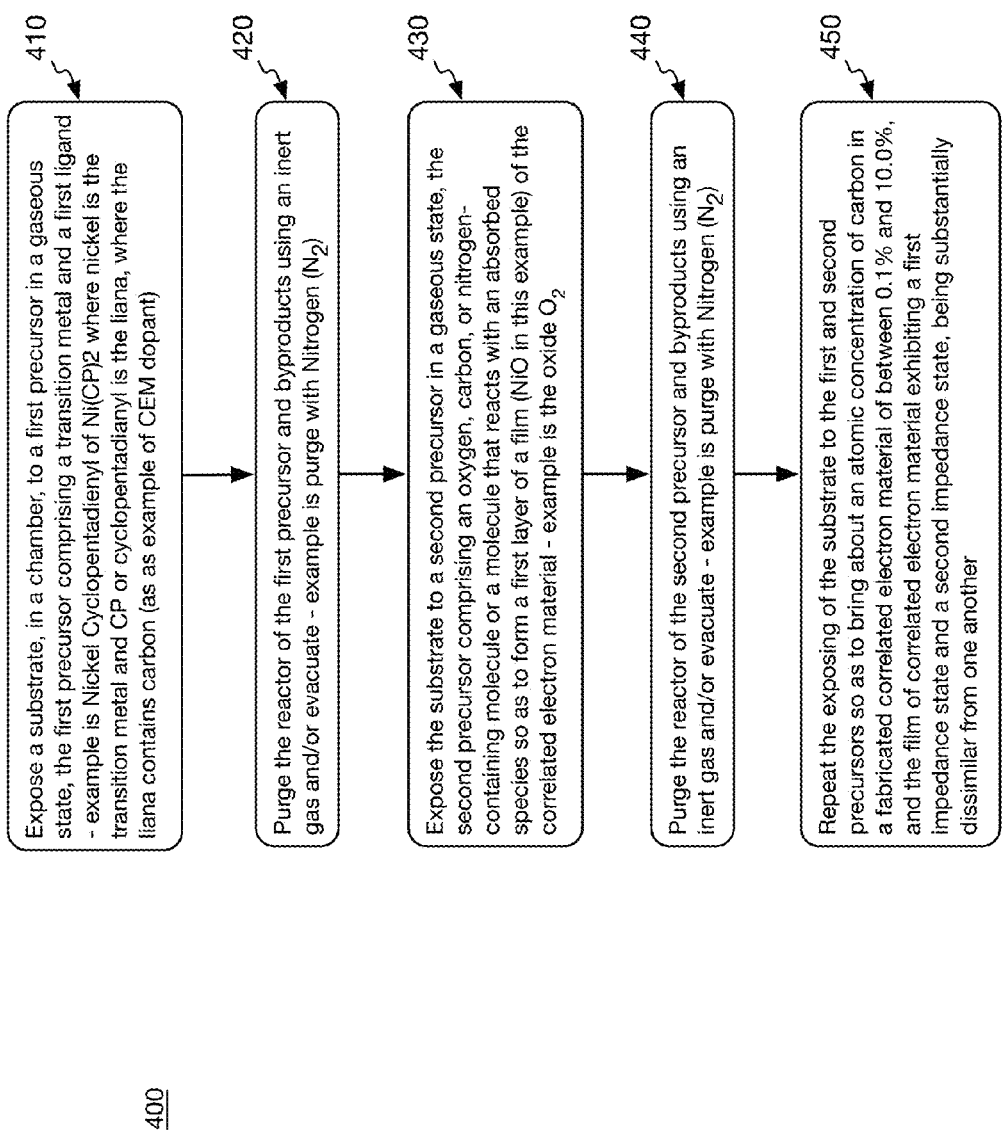
FIG. 4a depicts a simplified flowchart for an example process for fabricating correlated electron material devices, in accordance with an embodiment.

FIG. 4A shows a simplified flowchart for an example embodiment of a method for fabricating correlated electron device materials according to an embodiment 400. Example implementations, such as described in FIGS. 4A, 4B, and 4C, for example, may include blocks in addition to those shown and described, fewer blocks, or blocks occurring in an order different than may be identified, or any combination thereof. In an embodiment, a method may include blocks 410, 420, 430, 440 and/or 450, for example. An example embodiment of FIG. 4A may accord with the general description of atomic layer deposition previously described herein. The method of FIG. 4A may begin at block 210, which may comprise exposing a substrate, in a heated chamber, for example, to a first precursor in a gaseous state (e.g., "AX"), wherein the first precursor comprises a transition metal oxide, a transition metal, a transition metal compound or any combination thereof, and a first ligand. An example embodiment may continue at block 420, which may comprise removing the precursor AX and byproducts of AX by using an inert gas or evacuation or combination. An example embodiment may continue at block 430, which may comprise exposing the substrate to a second precursor (e.g., BY) in a gaseous state, wherein the second precursor comprises a oxide so as to form a first layer of the film of a CEM device. An example embodiment may continue at block 440, which may comprise removing the precursor BY and byproducts of BY through the use of an inert gas or evacuation or combination. An example embodiment may continue at block 450, which may comprise repeating the exposing of the substrate to the first and second precursors with intermediate purge and/or evacuation steps so as to form additional layers of the film until the correlated electron material is capable of exhibiting a ratio of first to second impedance states of at least 5.0:1.0.

FIG. 4B shows a simplified flowchart for an example embodiment of a method for fabricating correlated electron device materials according to an embodiment 460. An example embodiment of FIG. 4B may accord with the general description of chemical vapor deposition or CVD and/or variations of CVD such as plasma enhanced CVD and/or others. In FIG. 4B, such as at block 460, a substrate may be exposed to precursor AX and BY simultaneously under conditions of pressure and temperature to promote the formation of Aft which corresponds to a CEM. Additional approaches may be employed to bring about formation of a CEM, such as application of direct and/or remote plasma, use of hot wire to partially decompose precursors, and/or lasers to enhance reactions as examples of forms of CVD. Example CVD film processes and/or variations may be employed for a duration and/or under conditions as can be determined by one skilled in the art of CVD until, for example, correlated electron material having appropriate thickness and exhibiting appropriate properties, such as electrical properties, such as a ratio of first to second impedance states of at least 5.0:1.0, may be formed.

FIG. 4C shows a simplified flowchart for an example embodiment 470 of a method for fabricating correlated electron device materials. An example embodiment of FIG. 4C may accord with the general description of physical vapor deposition or PVD or Sputter Vapor Deposition or variations of these and/or related embodiments. In FIG. 4C a substrate may be exposed in a chamber, for example, to an impinging stream of precursor having a "line of sight" under particular conditions of temperature and pressure to promote formation of a CEM comprising material AB. A source of a precursor may be, for example, AB or A and B from separate "targets" wherein deposition is brought about using a stream of atoms or molecules that are physically or thermally or by other means removed (sputtered) from a target comprised of material A or B or AB and are in "line of sight" of the substrate in a process chamber whose pressure is low enough or lower such that the mean free path of the atoms or molecules or A or B or AB is approximately or more than the distance from the target to the substrate. A stream of AB (or A or B) or both may combine to form AB on the substrate due to conditions of the reaction chamber pressure, temperature of the substrate and other properties that are controlled by one skilled in the art of PVD and sputter deposition. In other embodiments of PVD and/or sputter deposition, the ambient environment may be a source such as BY or for example an ambient of $O_2$ for the reaction of sputtered nickel to form NiO doped with carbon or CO, for example co-sputtered carbon. A PVD film and its variations may continue for a time and under conditions as can be determined by one skilled in the art of PVD until correlated electron material of thickness and properties is deposited that is capable of exhibiting a ratio of first to second impedance states of at least 5.0:1.0, for example.

Figure 5:
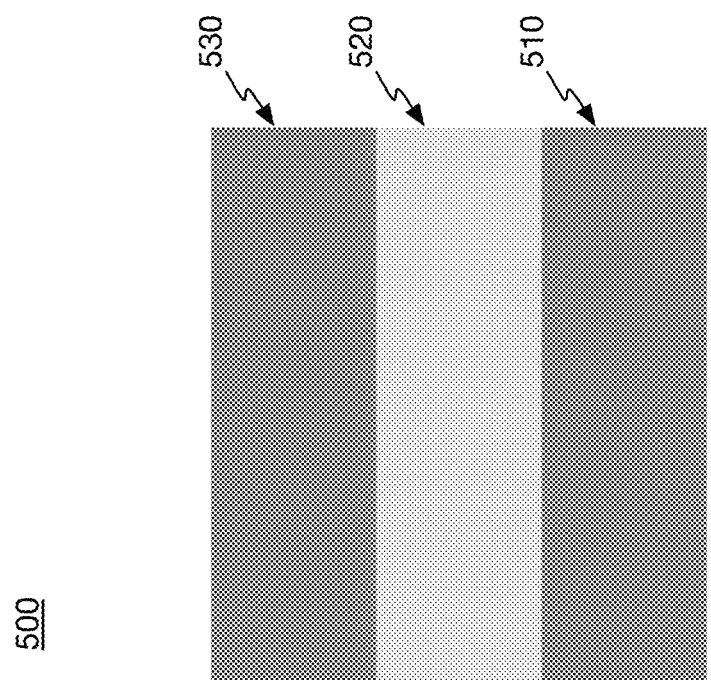
FIG. 5 is an illustration depicting a cross-sectional view of a portion of an example correlated electron material device, in accordance with an embodiment.

FIG. 5 is an illustration depicting a cross-sectional view of a portion of an example embodiment 500 of a correlated electron material device, in accordance with an embodiment. In an embodiment, a CEM device, such as example embodiment 500, may include a CEM, such as CEM 520, formed between one or more electrodes, such as bottom electrode 510 and top electrode 530, for example. In an embodiment, one or more electrodes, such as top electrode 530 and/or bottom electrode 510, may comprise a substantially electrically conductive material, such as TiN, for example, although claimed subject matter is not limited in scope in this respect. Also, in an embodiment, a CEM, such as CEM 520, may comprise a TMO material, such as example TMO materials previously mentioned.

In some circumstances, a relatively thin layer of a substantially non-conductive and/or insulative material, such as TiOx, for example, may develop in a region substantially adjacent to and/or part of an electrode, such as 510 and/or 530, due at least in part to oxidation of an electrode, such as 510 and/or 530. In some circumstances, such oxidation may occur due at least in part to exposure of a CEM device, such as 500, to an oxidizing ambient, such as, for example, $O_2$, $O_3$, NO, $N_2O$, $O^+$, $NO_2$, and/or $H_2O$, etc., and/or it may form at least in part due to heat cycles such as a deposition process to form an electrode, such as top electrode, 530, and oxygen from a CEM (for example NiO) oxidizing the electrode (such as TiN), thereby forming a subtantially non-conductive interlayer, such as $TiO_x$. Due at least in part to the development of the relatively thin layer of substantially non-conductive and/or insulative material, electrical conductivity between the electrode, such as 510 and/or 530, and a CEM, such as CEM 520, may be reduced, for example. Further, in at least some circumstances, the relatively thin layer of substantially non-conductive and/or insulative material, such as TiOx, may not switch impedance characteristics as one would expect with a CEM, such as 520. This may, in at least some circumstances, degrade the performance of a CEM device, such as 500, for example.

To prevent, at least in part, development of a relatively thin layer of substantially non-conductive and/or insulative material due at least in part to oxidation of one or more electrodes, such as explained above, a layer of electrically conductive material, such as Ir, for example, may be deposited and/or otherwise formed over an electrode, such as bottom electrode 510, such that upon oxidation of an electrode, such as 510, a conductive metal oxide (CMO) material, such as IrO, may be formed between an electrode such as bottom electrode 510, and a CEM, such as 520, as explained more fully below. Similarly, a layer of electrically conductive material, such as Ir, for example, may be deposited and/or otherwise formed over a CEM, such as 520, prior to formation of an electrode, such as top electrode 530, such that upon oxidation of an electrode, such as 530, a conductive metal oxide (CMO) material, such as 110, may be formed between an electrode, such as top electrode 530, and a CEM, such as 520, as also explained more fully below.

Figure 6:
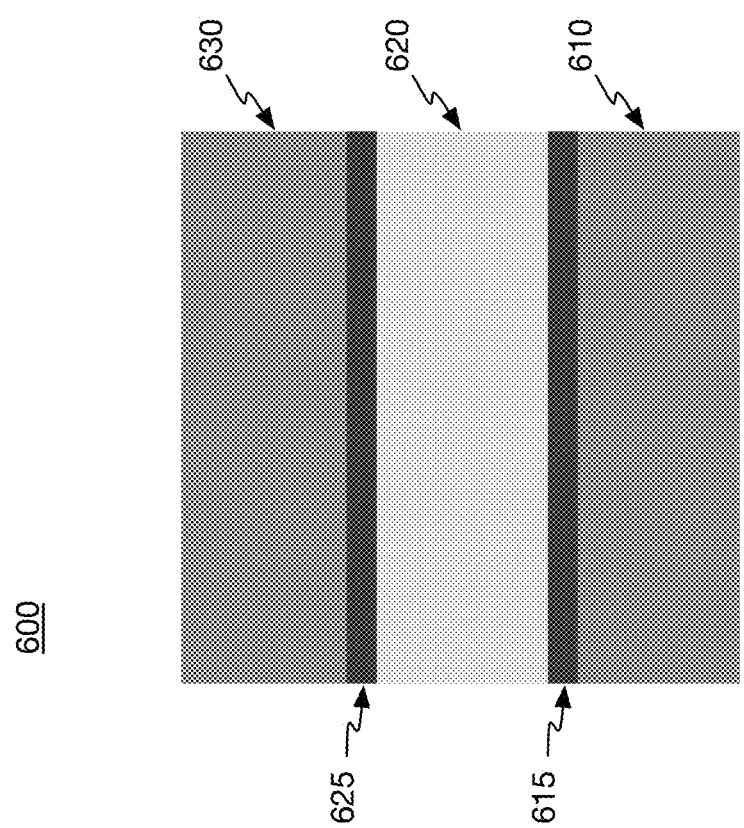
FIG. 6 is an illustration depicting a cross-sectional view of a portion of an example correlated electron material device including barrier layers at least in part to prevent oxidation of one or more electrodes and/or prevent formation of a substantially non-conducting and/or non-switching interface layer, in accordance with an embodiment.

FIG. 6 is an illustration depicting a cross-sectional view of a portion of an example embodiment 600 of a CEM device including barrier layers, such as 615 and 625, at least in part to prevent formation of a relatively thin layer of substantially non-conductive and/or insulative material, such as $TiO_x$, in a region substantially adjacent to and/or part of one or more electrodes, such as bottom electrode 610 and/or top electrode 630. For example, a bottom electrode, such as 610, may comprise an electrically conductive material, such as TiN, for example, that may be deposited as an operation in a formation of a metal-insulator-metal (MIM) structure of a CEM device, such as CEM device 600, for example. A relatively thin layer of electrically conductive material may be deposited and/or otherwise formed over an electrode, such as 610, prior to depositing a CEM TMO material, such as 620, to form a barrier layer, such as 615, that may, at least in part, prevent oxidation of an electrode, such as 610, and thereby prevent formation of a layer of non-conductive and/or insulative and/or non-CEM-like material, such as $TiO_x$.

In an embodiment, example electrically conductive materials that may be deposited and/or otherwise formed over an electrode, such as bottom electrode 610, may include, for example, Iridium (Ir), Rhenium (Re), Ruthenium (Ru), Tungsten (W); titanium (Ti)metal oxides, metal carbides, metal oxynitrides, metal oxycarbides, and/or metal oxycarbinitride, although claimed subject matter is not limited in scope in this respect. Upon exposure of a CEM device, such as 600, to an oxidizing ambient, such as, for example, $O_2$, $O_3$, NO, $N_2O$, $O^+$, $NO_2$, $H_2O_2$, and/or $H_2O$, etc., a relatively thin layer of electrically conductive material, such as Ir, may form a conductive oxide, such as $IrO_2$, to produce a barrier layer, such as 615. Similarly, a relatively thin layer of electrically conductive material, such as Re, may form a CMO material, such as $ReO_3$, and/or a relatively thin layer of electrically conductive material, such as Ru, may form a CMO material, such as $RuO_2$, for example, to produce a barrier layer, such as 615. Again, claimed subject matter is not limited in scope in these respects. Similarly, deposition and/or other formation of a CMO material, such as those mentioned above, for example, over a CEM, such as 620, prior to formation of an electrode, such as top electrode 630, may produce a barrier layer, such as 625. In an embodiment, barrier layer 625 may comprise a CMO material including, for example, $IrO_2$, $ReO_3$, and/or $RuO_2$, although again, claimed subject matter is not limited in scope in this respect. As mentioned, barrier layers 615 and/or 625 may prevent, at least in part, oxidation of one or more electrodes 610 and/or 630, thereby preventing formation of one or more layers of non-CEM-like and/or substantially non-conductive and/or insulative materials in a region substantially adjacent to and/or part of one or more electrodes 610 and/or 630, in an embodiment.

In one or more embodiments, deposition and/or other formation of a CMO material, such as to produce a barrier layer, such as 615 and/or 625, may occur as part of an electrode formation operation. Also, in one or more embodiments, deposition and/or other formation of a CMO material, such as to produce a barrier layer, such as 615 and/or 625, may occur as part of a stand-alone barrier layer formation operation. Further, in one or more embodiments, deposition and/or other formation of a CMO material, such as to produce a barrier layer, such as 615 and/or 625, may occur as part of a CEM material formation operation. Again, claimed subject matter is not limited in scope in these respects.

In one or more embodiments, formation of a barrier layer, such as 625, comprising a CMO material, such as 110, may be advantageously employed between a CEM, such as 620, and an electrode, such as top electrode 630, at least in part due to potential annealing of a MIM stack, such as CEM device 600, in an oxidizing ambient in an effort to provide improved performance, such as healing etch damage, for example. Such an oxidizing annealing may promote oxidation between an electrode, such as top electrode 630, and a CEM, such as 620, to form a relatively thin layer of non-CEM behaving insulative material unless a barrier layer, such as 625, is formed between a CEM, such as 620, and an electrode, such as top electrode 630, such as described above.

As utilized herein, the term "layer" and/or the like refers to one or more materials deposited and/or otherwise formed on, over, under, beneath, and/or around one or more materials and/or structures in a CEM device, such as CEM device 600. Example layers may be deposited and/or otherwise formed of any of a wide range of materials and/or by any of a wide range of processes and/or techniques, including those mentioned above. Further, example layers may comprise any of a wide range of thicknesses. For example, layers may have thicknesses ranging from approximately 1 Å-500 Å, in one or more embodiments. Also, in an embodiment, example barrier layers, such as 615, 625, 925, and/or 935, for example, may have thicknesses within a range of approximately 2 Å-50 Å. Further, in an embodiment, a "relatively thin layer" may comprise a layer having a thickness within a range of approximately 2 Å-50 Å, for example. Of course, claimed subject matter is not limited in scope to the specific examples mentioned herein.

Figure 7:
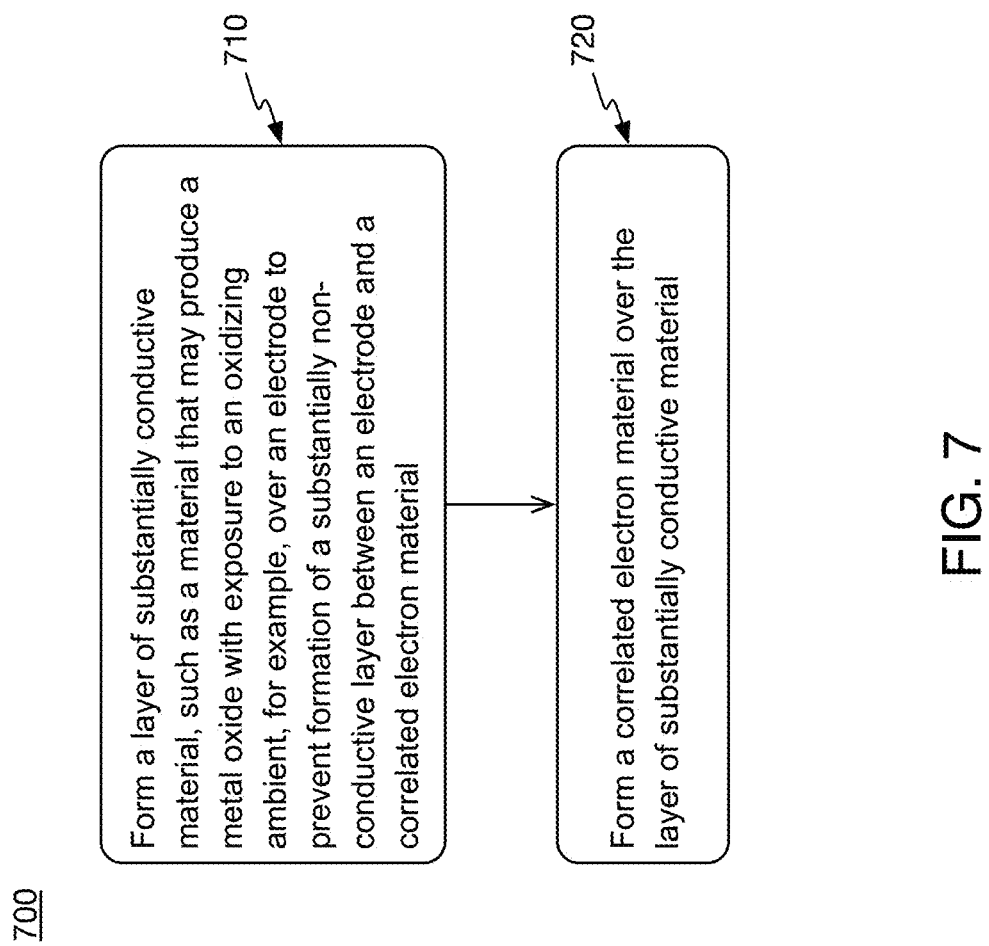
FIG. 7 depicts a simplified flowchart for an example process for fabricating correlated electron material devices including one or more barrier layers at least in part to prevent oxidation of one or more electrodes and/or prevent formation of a substantially non-conducting and/or non-switching interface layer, in accordance with an embodiment.

FIG. 7 depicts a simplified flowchart for an example embodiment 700 of a process for fabricating a CEM device, such as 600, including one or more barrier layers at least in part to prevent oxidation of one or more electrodes, such as 610, in accordance with an embodiment. Example embodiments may include all of blocks 710-720, may include more than blocks 710-720, and/or may include fewer than blocks 710-720. Further, the order of blocks 710-720 is merely an example order, and claimed subject matter is not limited in scope in these respects.

At block 710, a layer of substantially conductive material, such as a material that may produce a CMO with exposure to an oxidizing ambient, for example, may be formed over an electrode, such as 610, prior to formation of a CEM, such as 620, at least in part to prevent oxidation of one or more electrodes, such as 610, and therefore to prevent formation of a layer of a substantially non-conductive and/or non-CEM-like material between an electrode, such as 610, and a CEM, such as 620. In an embodiment, exposure of the layer of substantially conductive material to an oxidizing ambient may produce a barrier layer, such as 615, comprising a CMO, for example. Further, at block 720, a CEM, such as 620, may be deposited and/or otherwise formed over the layer of substantially conductive material.

Similarly, although not depicted in example embodiment 700, a relatively thin layer of substantially conductive material that may form a barrier layer, such as 625, may be formed and/or otherwise deposited over a CEM, such as 620, such as to prevent, at least in part, formation of a layer of substantially non-conductive material between an electrode, such as top electrode 630, and a CEM, such as CEM 620. In an embodiment, an electrode, such as 630, may be formed and/or otherwise deposited over a CEM, such as CEM 620, for example. In this manner, in an embodiment, both top and bottom electrodes, such as 610 and 630, for example, may be protected, at least in part, from oxidation, and/or from formation of a substantially non-conductive layer between electrodes, such as 610 and 630, and a CEM, such as CEM 620, for example.

Figure 8:
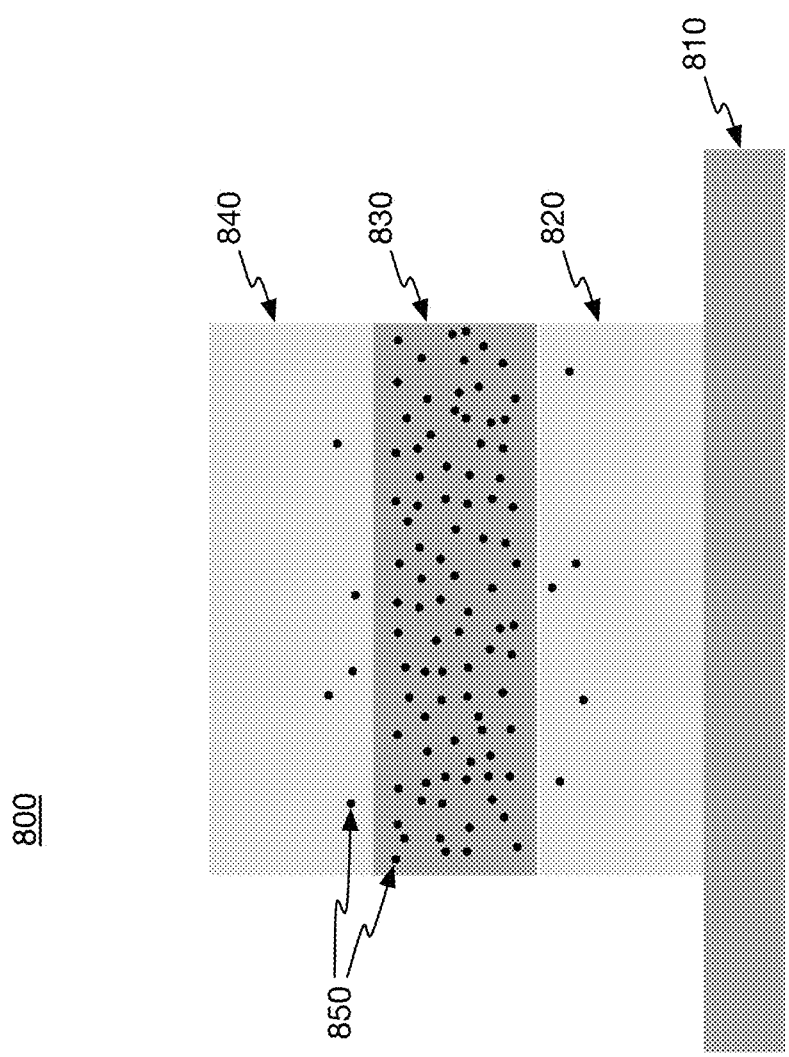
FIG. 8 is an illustration depicting a cross-sectional view of a portion of an example correlated electron material device, in accordance with an embodiment.

FIG. 8 is an illustration depicting a cross-sectional view of a portion of an example embodiment 800 of a CEM device, in accordance with an embodiment. In an embodiment, a CEM device, such as example embodiment 800, may include a CEM, such as CEM 830, formed between one or more electrodes, such as bottom electrode 820 and top electrode 840, for example. In an embodiment, an electrode, such as bottom electrode 820, may be formed and/or otherwise deposited over a substrate, such as 810, in an embodiment. In an embodiment, one or more electrodes, such as top electrode 840 and/or bottom electrode 840, may comprise a substantially electrically conductive material, such as TiN, for example, although claimed subject matter is not limited in scope in this respect. Also, in an embodiment, a CEM, such as CEM 830, may comprise a TMO material, such as example TMO materials previously mentioned.

In some circumstances, CEM TMO materials, such as NiO, VO, TiO, and/or others, for example, when doped with Carbon (C), and/or Carbonyl (CO) may behave as correlated electron materials, in that the impedance characteristics of the material may change with current and/or voltage in a substantially bulk fashion. In one or more embodiments, C and/or CO may comprise dopants in a CEM film, for example, and in some embodiments relatively high dopant amounts, such as from <0.1% to 10%, for example, may be employed. In one or more embodiments, C and/or CO, for example, may contribute to CEM impedance bulk-switching characteristics.

In some circumstances, following deposition and/or other formation of a CEM, such as 830, an electrode, such as 840, and/or other layers of materials, such as metal layers, for example, may be formed, which may involve application of heat. In some circumstances, application of heat to a CEM with C and/or CO dopants may result in diffusion of the C and/or CO, for example. C and/or CO dopants are depicted in the example illustration of FIG. 8 as elements 850. As depicted in FIG. 8, C and/or CO dopants 850 may diffuse into one or more electrodes, such as 820 and/or 850. In some circumstances, loss of C and/or CO dopant in a CEM, such as CEM 830, may result in altered and/or reduced performance of a CEM. Further, in some circumstances, diffusion of C and/or CO 850, for example, into one or more electrodes, such as 820 and/or 840 may increase resistivity of the electrodes, thereby potentially negatively impacting performance of a CEM device, such as CEM device 800.

Figure 9:
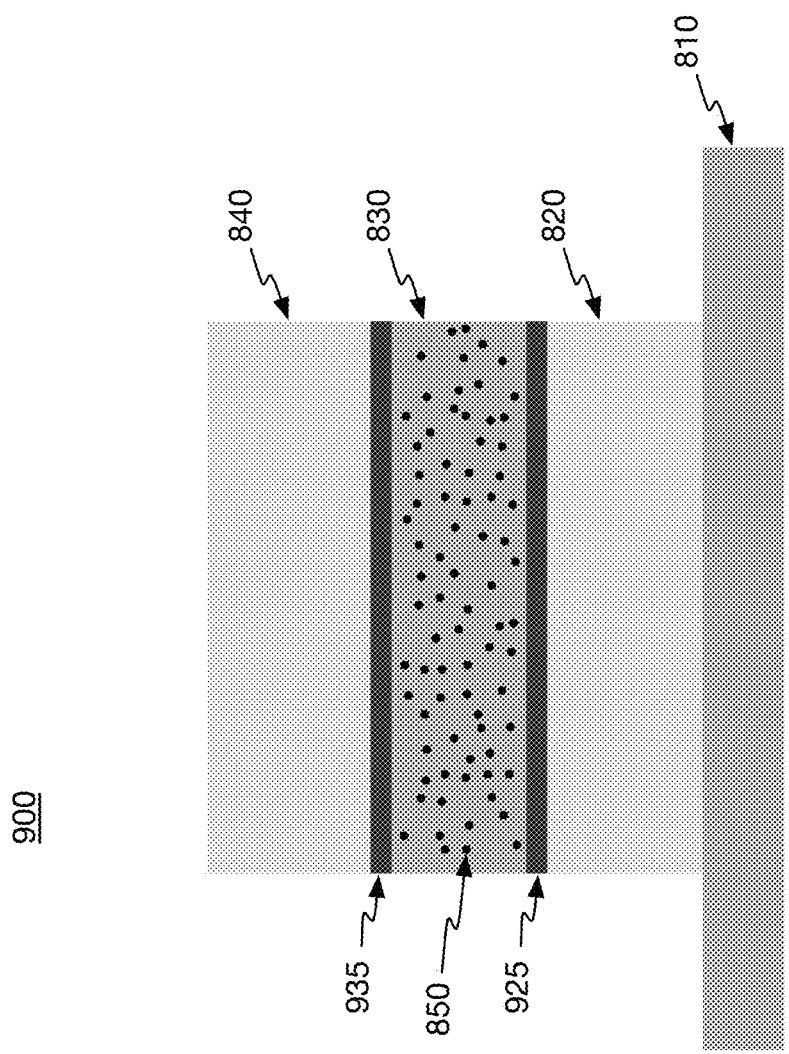
FIG. 9 is an illustration depicting a cross-sectional view of a portion of an example correlated electron material device including barrier layers at least in part to prevent carbon diffusion from a correlated electron material, in accordance with an embodiment.

FIG. 9 is an illustration depicting a cross-sectional view of a portion of an example embodiment 900 of a CEM device including barrier layers, such as 925 and/or 935, at least in part to prevent C and/or CO 850 diffusion from a CEM, such as CEM 830, in accordance with an embodiment. In an embodiment, to prevent, at least in part, diffusion of C and/or CO diffusion from a CEM, such as CEM 830, into one or more electrodes, such as 820 and/or 840, one or more relatively thin, conductive layers may be deposited and/or otherwise formed between one or more electrodes, such as 820 and/or 840, and a CEM, such as 830, to produce one or more barrier layers, such as 925 and/or 935. Example materials that may be deposited and/or otherwise formed to produce one or more barrier layers, such as 925 and/or 935, may include, but are not limited to, TiN, TiCN, TiON, RuON, ReOxNy, $ReO_3$, $RuO_2$, WN, and/or $IrO_2$, for example. Example characteristics for materials that may be employed in barrier layers, such as 925 and/or 935, may include relatively low resistivity and ability to act as barriers to C and/or CO 850, in an embodiment.

In an embodiment, a barrier layer, such as 925, may be deposited and/or otherwise formed prior to deposition and/or other formation of a CEM, such as CEM 830, and another barrier layer, such as 935, may be deposited and/or otherwise formed over a CEM, such as CEM 830. In an embodiment, one or more barrier layers, such as 925 and/or 935, may be deposited and/or otherwise formed at least in part via atomic layer deposition (ALD), chemical vapor deposition (CVD), and/or physical vapor deposition (PVD), and/or plasma enhanced versions of the aforementioned, although claimed subject matter is not limited in scope in this respect.

Figure 10:
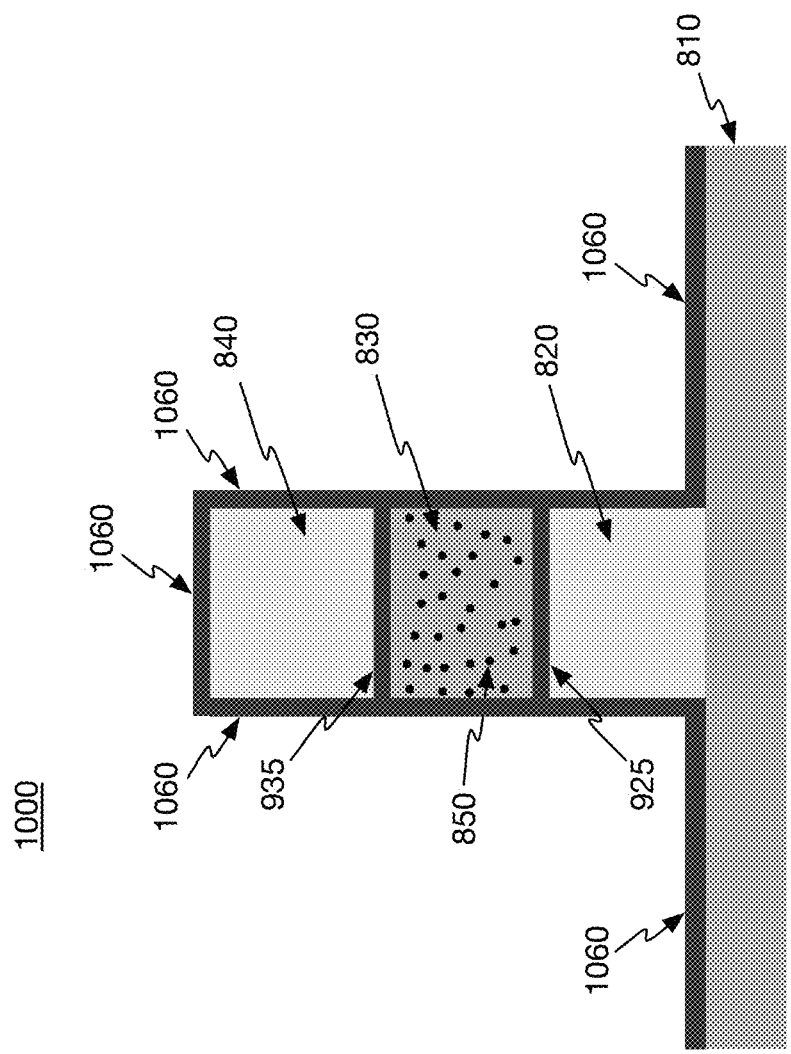
FIG. 10 is an illustration depicting a cross-sectional view of a portion of an example correlated electron material device including a conformal barrier layer at least in part to prevent out diffusion from edges of correlated electron material, in accordance with an embodiment.

FIG. 10 is an illustration depicting a cross-sectional view of a portion of an example embodiment 1000 of a CEM device including barrier layers, such as 925 and/or 935, at least in part to prevent C and/or CO 850 diffusion from a CEM, such as CEM 830, in accordance with an embodiment. As depicted in FIG. 10, for example embodiment 1000 of a CEM device, a stack comprising a bottom electrode, such as 820, a CEM, such as 830, and a top electrode, such as 840, may be etched. In an embodiment, a barrier layer and/or film, such as 1060, may be deposited and/or otherwise formed via a conformal technique, such as via ALD, for example, to deposit a barrier layer, such as 1060, on the edges of the etched stack to prevent, at least in part, out diffusion of C and/or CO 850 from the edges. Additionally, in an embodiment, a barrier layer, such as 1060, may protect, at least in part, the edges of the etched stack, for example. In an embodiment, a device side wall barrier may also be deposited before the bottom electrode in situations in which a CEM device may be integrated into an existing trench, hole, and/or other feature having existing walls, for example.

Figure 11:
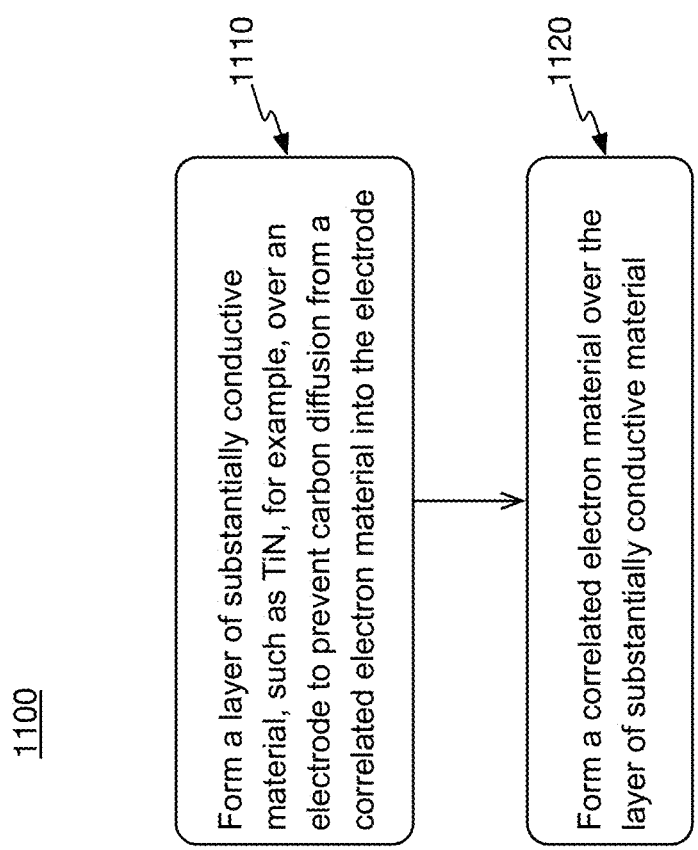
FIG. 11 depicts a simplified flowchart for an example process for fabricating correlated electron material devices including one or more barrier layers at least in part to prevent carbon diffusion from a correlated electron material, in accordance with an embodiment.

FIG. 11 depicts a simplified flowchart for an example embodiment 1100 of a process for fabricating correlated electron material devices including one or more barrier layers at least in part to prevent C and/or CO diffusion, for example, from a CEM, such as 830, in accordance with an embodiment. Example embodiments may include all of blocks 1110-1120, may include more than blocks 1110-1120, and/or may include fewer than blocks 1110-1120. Further, the order of blocks 1110-1120 is merely an example order, and claimed subject matter is not limited in scope in these respects.

At block 1110, in an embodiment, a relatively thin layer of substantially conductive material, such as TiN, for example, may be formed over an electrode, such as 820, to prevent, at least in part, diffusion of C and/or CO from a CEM, such as CEM 830, into the electrode, such as 820. Further, as depicted at block 1120, a CEM, such as CEM 830, may be formed over a the layer of substantially conductive material, in an embodiment. In an embodiment, a carbon diffusion barrier layer, such as 935, may comprise the same layer as an oxidation barrier layer, such as 615, and/or it may comprise an additional layer. This is, in an embodiment, a CEM device may include one or more carbon diffusion barrier layers, such as 925, and/or one or more oxidation barrier layers, such as 615, and/or may include one or more barrier layers providing both prevention of carbon diffusion and oxidation, for example.

In an embodiment, the relatively thin layer of substantially electrically conductive material may comprise a barrier layer, such as 925, for example. Similarly, although not depicted in example embodiment 1100, a relatively thin layer of substantially conductive material may be formed and/or otherwise deposited over a CEM, such as 830, to form a barrier layer, such as 935, for example, such as to prevent, at least in part, diffusion of C and/or CO, such as 850, from a CEM, such as 830, into an electrode, such as 840, that may be formed over a CEM, such as CEM 830. In this manner, in an embodiment, barrier layers 925 and 935 both may prevent diffusion of C and/or CO, such as 850, from diffusion from a CEM, such as CEM 830, into one or more of electrodes 820 and/or 840, for example.

In an embodiment, an example method may comprise forming a layer of substantially conductive material between an electrode and a correlated electron material to prevent, at least in part, carbon diffusion from the correlated electron material into the electrode. Further, in an embodiment, the substantially conductive material may comprise one or more of TiN, TiCN, TiON, RuON, ReOxNy, $ReO_3$, $RuO_2$, WN, or $IrO_2$, or any combination thereof, for example. Additionally, in an embodiment, the correlated electron material may comprise a transition metal oxide doped with carbon. In an embodiment, the transition metal oxide may comprise one or more of NiO, VO, and/or TiO, or any combination thereof, for example. Also, in an embodiment, dopant amounts, such as for carbon, for example, may range from approximately less than 0.1% to approximately 10%, for example.

Further, in an embodiment, an example method may further comprise forming a second layer of substantially conductive material between the correlated electron material and a second electrode to prevent carbon diffusion from the correlated electron material into the second electrode.

In an embodiment, an apparatus may comprise a layer of substantially conductive material positioned between an electrode and a correlated electron material to prevent carbon diffusion from the correlated electron material into the electrode. Further, in an embodiment, the substantially conductive material may comprise one or more of TiN, TiCN, TiON, RuON, ReOxNy, $ReO_3$, $RuO_2$, WN, or $IrO_2$, or any combination thereof, for example. Additionally, in an embodiment, the correlated electron material may comprise a transition metal oxide doped with carbon. Also, in an embodiment, the transition metal oxide may comprise one or more of NiO, VO, and/or TiO, or any combination thereof, for example, and dopant amounts, such as for carbon, for example, may range from approximately less than 0.1% to approximately 10%, for example.

Additionally, in an embodiment, the apparatus may further comprise a second layer of substantially conductive material positioned between the correlated electron material and a second electrode to prevent, at least in part, carbon diffusion from the correlated electron material into the second electrode.

In an embodiment, an example process may include forming a layer of substantially conductive material between an electrode and a correlated electron material to prevent correlated electron material dopant such as carbon from diffusing out of the correlated electron material. In an example embodiment, the substantially conductive material may comprise a substantially conductive metal oxide, metal nitride, or metal carbide, or any combination thereof.

Further, in an embodiment, a forming of a layer of substantially conductive material over an electrode may comprise depositing a layer of metal material over the electrode and exposing the metal material to an oxidizing ambient material to produce, at least in part, a substantially conductive metal oxide, metal carbide, metal oxynitride, metal oxycarbide, or metal oxycarbinitride, or any combination thereof. In an embodiment, a metal material may comprise Ir, Re, W, Ti or Ru, or any combination thereof. Additionally, in an embodiment, a substantially conductive metal oxide may comprise $IrO_xN_yC_z$, $ReO_xN_yC_z$, $RuO_xN_yC_z$, $WO_xN_yC_z$, or $TiO_xN_yC_z$, (x, y, and z≥0), or any combination thereof. Further, in an embodiment, an oxidizing ambient material may comprise $O_2$, $O_3$, NO, $N_2O$, O*, $NO_2$, $H_2O_2$ or $H_2O$, or any combination thereof.

Also, in an embodiment, an example process may include forming a second layer of substantially conductive material over a correlated electron material and forming a second electrode over the second layer of substantially conductive material, wherein the second layer of substantially conductive material prevents correlated electron material dopant, such as carbon, from diffusing out of the CEM.

In an additional embodiment, an apparatus may comprise a layer of substantially conductive material positioned on an electrode to carbon diffusion out of the CEM and a correlated electron material positioned over the layer of substantially conductive material. A substantially conductive material may comprise a substantially conductive metal oxide, in an embodiment. Also, in an embodiment, a substantially conductive metal oxide material may comprise a metal material to be exposed to an oxidizing ambient material, wherein the metal material may include Ir, Re, W, Ti or Ru, or any combination thereof, for example. Additionally, substantially conductive metal oxide may comprise $IrO_xN_yC_z$, $ReO_xN_yC_z$, $RuO_xN_yC_z$, $WO_xN_yC_z$, or $TiO_xN_yC_z$, (x, y, z≥0), or any combination thereof. In an embodiment, an oxidizing ambient material may include $O_2$, $O_3$, NO, $N_2O$, $O^+$, $NO_2$, $H_2O_2$ or $H_2O$, or any combination thereof.

Further, in an embodiment, an apparatus may further include a second layer of substantially conductive material positioned over the correlated electron material and a second electrode positioned over the second layer of substantially conductive material, wherein the second layer of substantially conductive material to prevent diffusion of a dopant out of a correlated electron material.

An additional embodiment may include a layer of substantially conductive material disposed between an electrode and a correlated electron material, wherein the substantially conductive material comprises a substantially conductive metal compound to prevent, at least in part, diffusion of a dopant out of a correlated electron material. In an embodiment, a substantially conductive metal compound material may come in contact with a CEM dopant layer and/or may be subsequently exposed to processes that may otherwise result in diffusion of the CEM dopant out of the CEM film into the electrode. In an embodiment, a metal compound material may include Ir, Re, W, Ti, or Ru, or any combination thereof. Also, in an embodiment, a substantially conductive metal oxide may comprise $IrO_xN_yC_z$, $ReO_xN_yC_z$, $RuO_xN_yC_z$, $WO_xN_yC_z$, or $TiO_xN_yC_z$, (x, y, z≥0), or any combination thereof. Of course, claimed subject matter is not limited in scope in these respects.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Additionally, in the present disclosure, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

What is claimed is:

1. A method, comprising:
    forming a layer of substantially conductive material over a correlated electron material to prevent diffusion of a dopant from the correlated electron material, including forming the layer of substantially conductive material on one or more edges of an etched stack including the correlated electron material and including forming the layer of substantially conductive material between an electrode and the correlated electron material.

2. The method of claim 1, wherein the dopant comprises carbon.

3. The method of claim 1, wherein the forming the layer of substantially conductive material to prevent diffusion of the dopant from the correlated electron material comprises forming the layer of substantially conductive material to prevent diffusion of the dopant from the correlated electron material into the electrode.

4. The method of claim 1, wherein the substantially conductive material comprises one or more of TiN, TiCN, TiON, RuON, ReOxNy, $ReO_3$, $RuO_2$, WN, or $IrO_2$, or any combination thereof.

5. The method of claim 1, wherein the correlated electron material comprises a transition metal oxide doped with carbon.

6. The method of claim 1, further comprising:
    forming a second layer of substantially conductive material between the correlated electron material and a second electrode to prevent diffusion of the dopant from the correlated electron material into the second electrode.

7. The method of claim 1, wherein the layer of substantially conductive material comprises a thickness of no more than 50 Å.

8. An apparatus, comprising:
    a layer of substantially conductive material formed over a correlated electron material to prevent diffusion of a dopant from the correlated electron material, the layer of substantially conductive material to include at least a portion formed on one or more edges of an etched stack to include the correlated electron material, the layer of substantially conductive material positioned between an electrode and the correlated electron material.

9. The apparatus of claim 8, wherein the dopant to comprise carbon.

10. The apparatus of claim 8, wherein the layer of substantially conductive material to prevent diffusion of the dopant into the electrode.

11. The apparatus of claim 8, wherein the substantially conductive material to comprise one or more of TiN, TiCN, TiON, RuON, ReOxNy, $ReO_3$, $RuO_2$, WN, or $IrO_2$, or any combination thereof.

12. The apparatus of claim 8, wherein the correlated electron material to comprise a transition metal oxide doped with carbon, and wherein the layer of substantially conductive material to prevent diffusion of the carbon into the electrode.

13. The apparatus of claim 8, wherein the layer of substantially conductive material to comprise a thickness of no more than 50 Å.

14. The apparatus of claim 8, further comprising:
a second layer of substantially conductive material positioned between the correlated electron material and a second electrode to prevent diffusion of the dopant from the correlated electron material into the second electrode.

15. A layer disposed between an electrode and a correlated electron material, comprising:
a substantively conductive material to include one or more of TiN, TiCN, TiON, RuON, ReOxNy, $ReO_3$, $RuO_2$, WN, or $IrO_2$, or any combination thereof, to prevent diffusion of a dopant from the correlated electron material, wherein the layer to include at least a portion formed on one or more edges of an etched stack to include the correlated electron material.

16. The layer of claim 15, wherein the dopant to comprise carbon.

17. The layer of claim 15, wherein the layer of substantially conductive material to prevent diffusion of the dopant into the electrode.

18. The layer of claim 15, wherein the correlated electron material to comprise a transition metal oxide doped with carbon.

19. The layer of claim 15, wherein the substantially conductive material to comprise a thickness of no more than 50 Å.

* * * * *